US006480393B1

(12) United States Patent
Chen

(10) Patent No.: US 6,480,393 B1
(45) Date of Patent: Nov. 12, 2002

(54) CARD HOLDER FOR SECURING EXPANSION CARDS

(75) Inventor: Yun-Lung Chen, Taipei (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/981,857

(22) Filed: Oct. 17, 2001

(51) Int. Cl.[7] .................................................. H05K 7/14
(52) U.S. Cl. ........................ 361/759; 361/732; 361/801; 361/825; 312/223.2; 211/41.17
(58) Field of Search ................................ 361/724, 726, 361/730, 732, 753, 759, 801, 825; 312/223.1; 211/41.17

(56) References Cited

U.S. PATENT DOCUMENTS

| | | | | |
|---|---|---|---|---|
| 5,575,546 A | * | 11/1996 | Radloff | 174/35 R |
| 5,694,291 A | * | 12/1997 | Feightner | 361/683 |
| 5,757,618 A | * | 5/1998 | Lee | 361/686 |
| 5,936,835 A | * | 8/1999 | Astier | 361/683 |
| 6,231,139 B1 | * | 5/2001 | Chen | 312/223.2 |

* cited by examiner

Primary Examiner—Jayprakash N. Gandhi
(74) Attorney, Agent, or Firm—Wei Te Chung

(57) ABSTRACT

A card holder for securing expansion cards (10) includes a rear panel (20) of enclosure and a locating plate (40). A shield (22) is perpendicularly stamped from the rear panel. A screw hole (28) is defined in the shield. Expansion slots (25) are defined in the rear panel at a side of the shield, for receiving slot covers (12) of the expansion cards. The locating plate includes a pressing portion (42) and a securing portion (44). The securing portion is attached to the rear panel at an opposite side of the shield. A through hole (47) is defined in the pressing portion corresponding to the screw hole of the shield, for insertion of a screw (50) therethrough. The pressing portion cooperates with the shield to sandwich heads (14) of the expansion cards therebetween. The expansion cards are thereby secured to the rear panel by the card holder.

16 Claims, 4 Drawing Sheets

CARD HOLDER FOR SECURING EXPANSION CARDS

BACKGROUND OF THE INVENTION

1. Field of the Invention

The present invention relates to card holders, and more particularly to card holders which readily and firmly secure expansion cards in a computer enclosure.

2. Description of Related Art

With continued development of computers, a wide variety of optional extra devices are available for adding to a computer to increase its performance and functions. Expansion cards are the most common add-on devices used to enhance computers. Almost all computers use any of a variety of expansion cards such as network cards, sound cards, and SCSI cards. Consequently, a typical computer enclosure is configured to have a number of expansion slots that allow users to install optional expansion cards.

Conventionally, expansion cards are directly secured in a computer enclosure one by one, using bolts. Each expansion card needs one bolt. Fastening or detachment of the bolts is unduly time-consuming and laborious. This retards the efficiency of installation and removal of the expansion cards. These problems are multiplied in mass production facilities, and result in increased costs.

Examples of the abovementioned means for securing expansion cards are found in Taiwan Patent Applications Nos. 84206442, 85218324 and 87200066.

SUMMARY OF THE INVENTION

Accordingly, an object of the present invention is to provide a card holder which readily and conveniently secures expansion cards to a computer enclosure.

In order to achieve the object set out above, a card holder of the present invention for securing expansion cards comprises a rear panel of an enclosure and a locating plate. A shield is perpendicularly stamped from the rear panel. A screw hole is defined in the shield. Expansion slots are defined in the rear panel at one side of the shield, for receiving slot covers of the expansion cards. The locating plate comprises a pressing portion and a securing portion. The securing portion is attached to the rear panel at an opposite side of the shield. A through hole is defined in the pressing portion corresponding to the screw hole of the shield, for insertion of a screw therethrough. The pressing portion cooperates with the shield to sandwich heads of the expansion cards therebetween. The expansion cards are thereby secured to the rear panel by the card holder.

Other objects, advantages and novel features of the present invention will become more apparent from the following detailed description when taken in conjunction with the accompanying drawings.

DETAILED DESCRIPTION OF THE INVENTION

Figure 1:
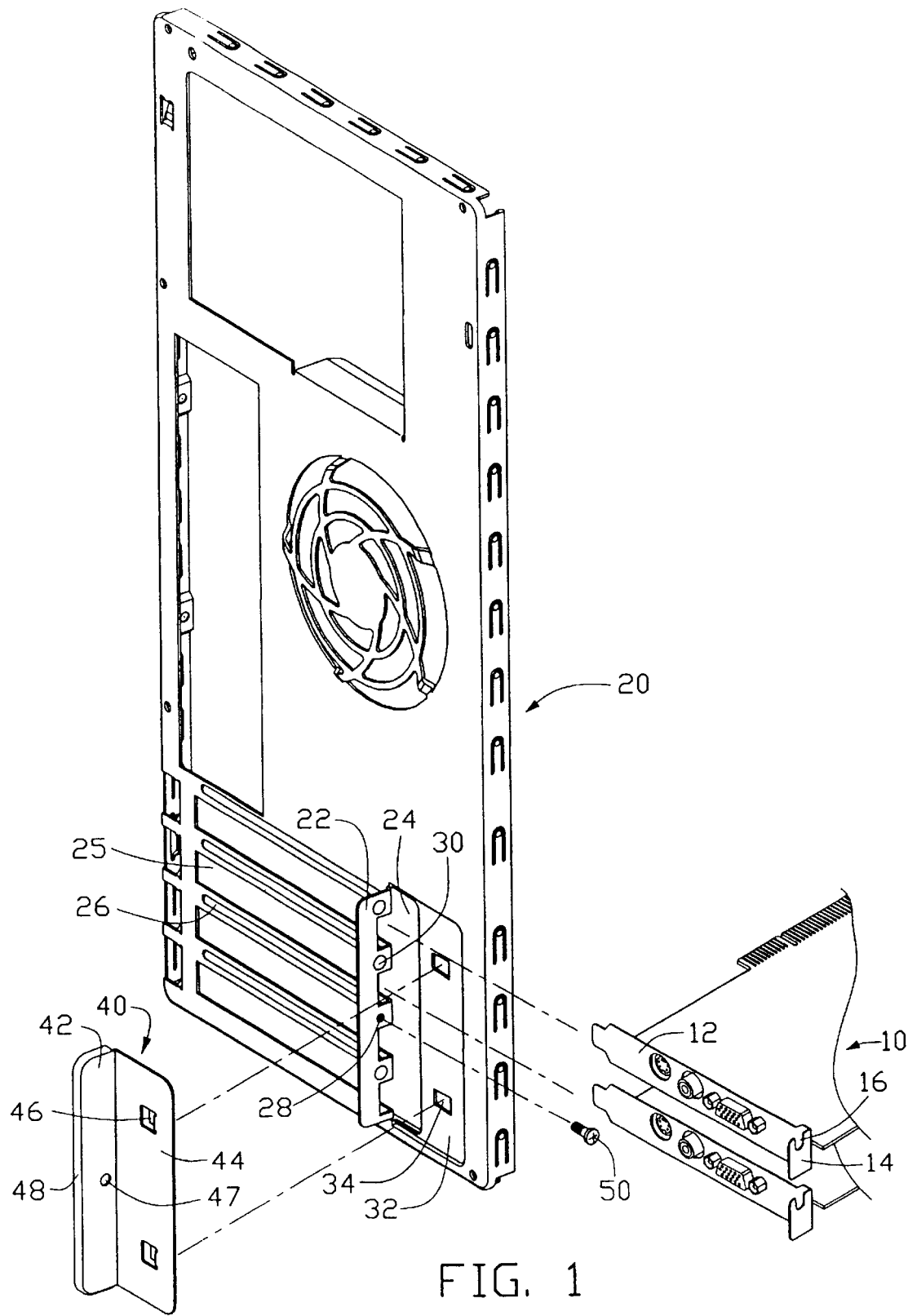
FIG. 1 is an exploded view of a card holder in accordance with the present invention, together with a screw and two expansion cards partly cut away.

Reference will now be made to the drawing figures to describe the preferred embodiment of the present invention in detail.

Referring to FIG. 1, a card holder in accordance with a preferred embodiment of the present invention comprises a rear panel 20 of a computer enclosure, and a locating plate 40, and a fastening member. The card holder cooperates with a fastening member to secure expansion cards 10 in the enclosure. In the preferred embodiment presented herein, the fastening member is a screw 50. Each expansion card 10 has an elongated slot cover 12, and a head 14 extending perpendicularly outwardly from an end of the slot cover 12. A U-shaped pit 16 is defined in an upper edge of the head 14.

The rear panel 20 forms a vertical shield 22 perpendicularly stamped therefrom. A vertical opening 24 is thereby defined in the rear panel 20. A plurality of horizontal and parallel expansion slots 25 is defined in the rear panel 20 at one side of the shield 22. Each expansion slot 25 communicates with a side extremity of the opening 24. The expansion slots 25 are spaced apart at uniform intervals, for providing access to and receiving the expansion cards 10. Partitions 26 are thus formed in the rear panel 20 between adjacent expansion slots 25. A further partition 26 is formed in the rear panel 20 above a topmost expansion slot 25. A screw hole 28 is defined in a middle portion of the shield 22 near one of the partitions 26. A plurality of protrusions 30 is formed on the shield 22, each protrusion being near one of the other partitions 26 respectively. The screw hole 28 and the protrusions 30 correspond to the pits 16 of the expansion cards 10. An indented portion 32 is formed in the rear panel 20 at an opposite side of the opening 24, by stamping the rear panel 20 in a direction opposite to a direction in which the shield 22 extends from the rear panel 20. A pair of trapezoidal fixing slots 34 is defined in the indented portion 32. Each fixing slot 34 tapers toward the opening 24.

Figure 2:
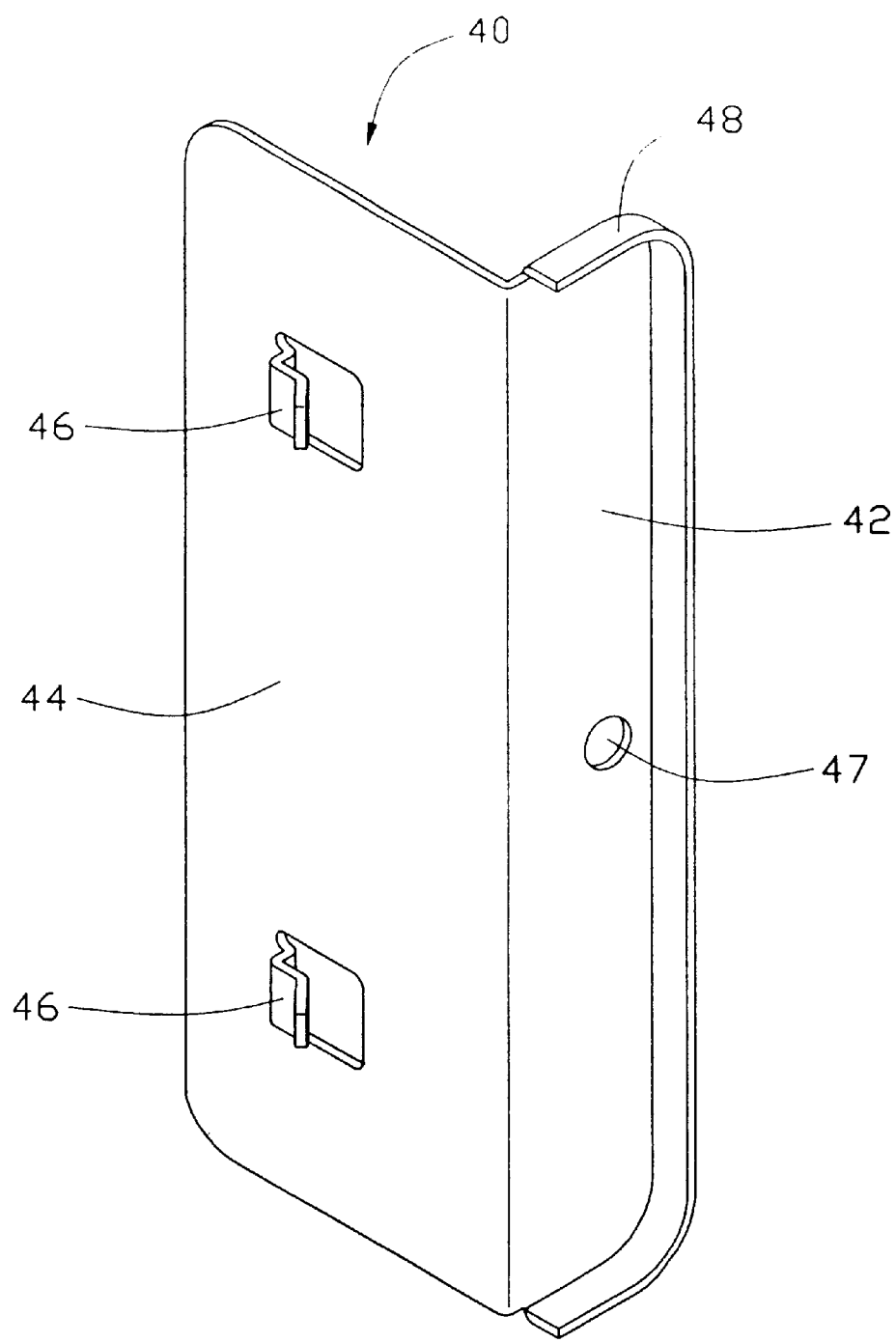
FIG. 2 is a perspective view of a locating plate of the card holder of FIG. 1.

Referring also to FIG. 2, the locating plate 40 of the card holder is stamped from a metal plate. The locating plate 40 comprises a pressing portion 42 and a securing portion 44 perpendicular to each other. The pressing portion 42 cooperates with the shield 22 of the rear panel 20 to sandwich the heads 14 of the expansion cards 10 therebetween. A pair of L-shaped hooks 46 is stamped from the securing portion 44, in a direction generally opposite to a direction in which the pressing portion 42 extends away from the securing portion 44. Free ends of the hooks 46 extend generally away from a longitudinal free edge of the securing portion 44. A through hole 47 is defined in a middle of the pressing portion 42, corresponding to the screw hole 28 of the shield 22. A flange 48 extends perpendicularly from free edges of the pressing portion 42, corresponding to free edges of the shield 22.

Figure 3:
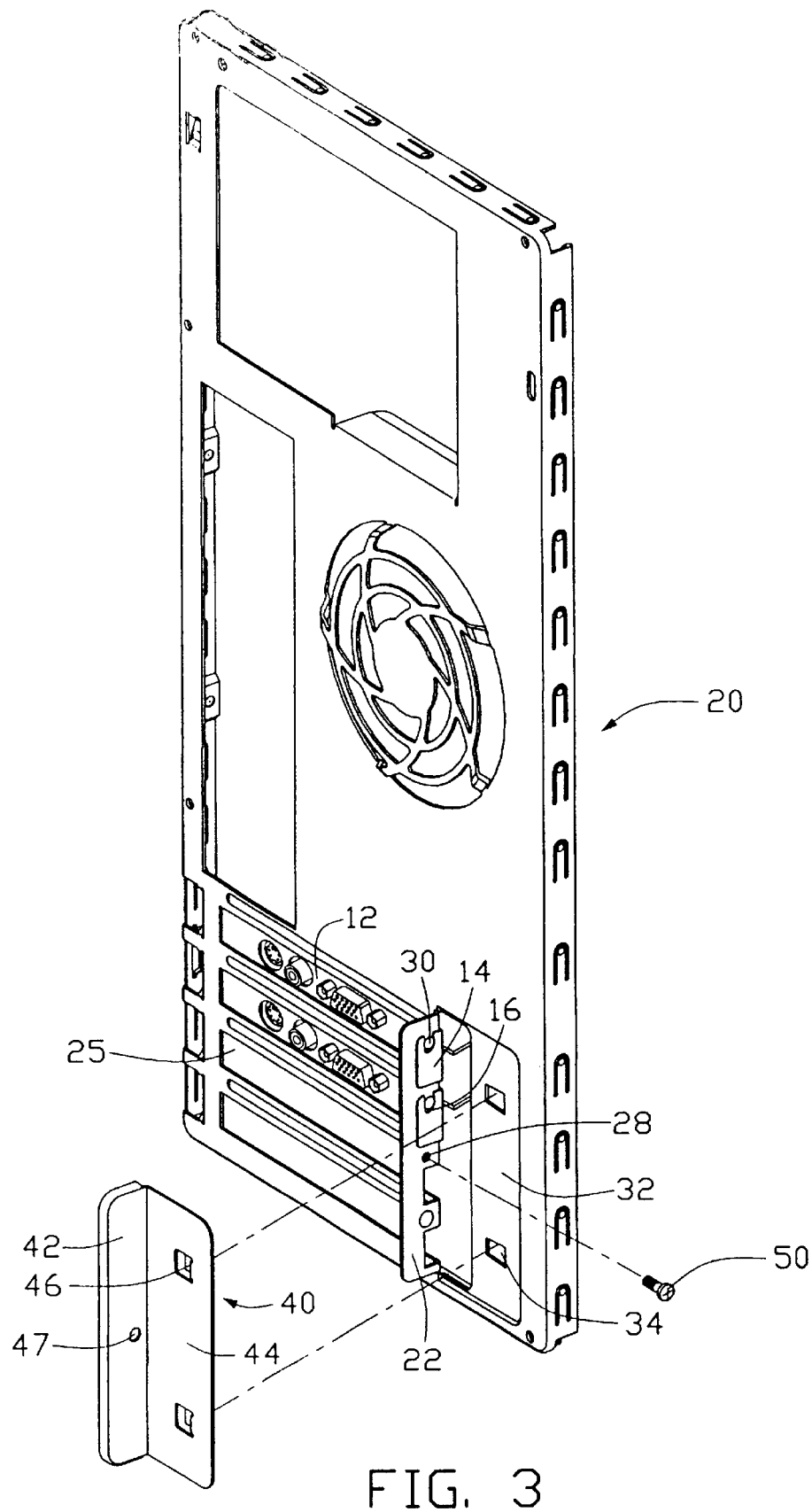
FIG. 3 is a partly-assembled view of FIG. 1, showing the expansion cards loosely attached to a rear panel of the card holder.
Figure 4:
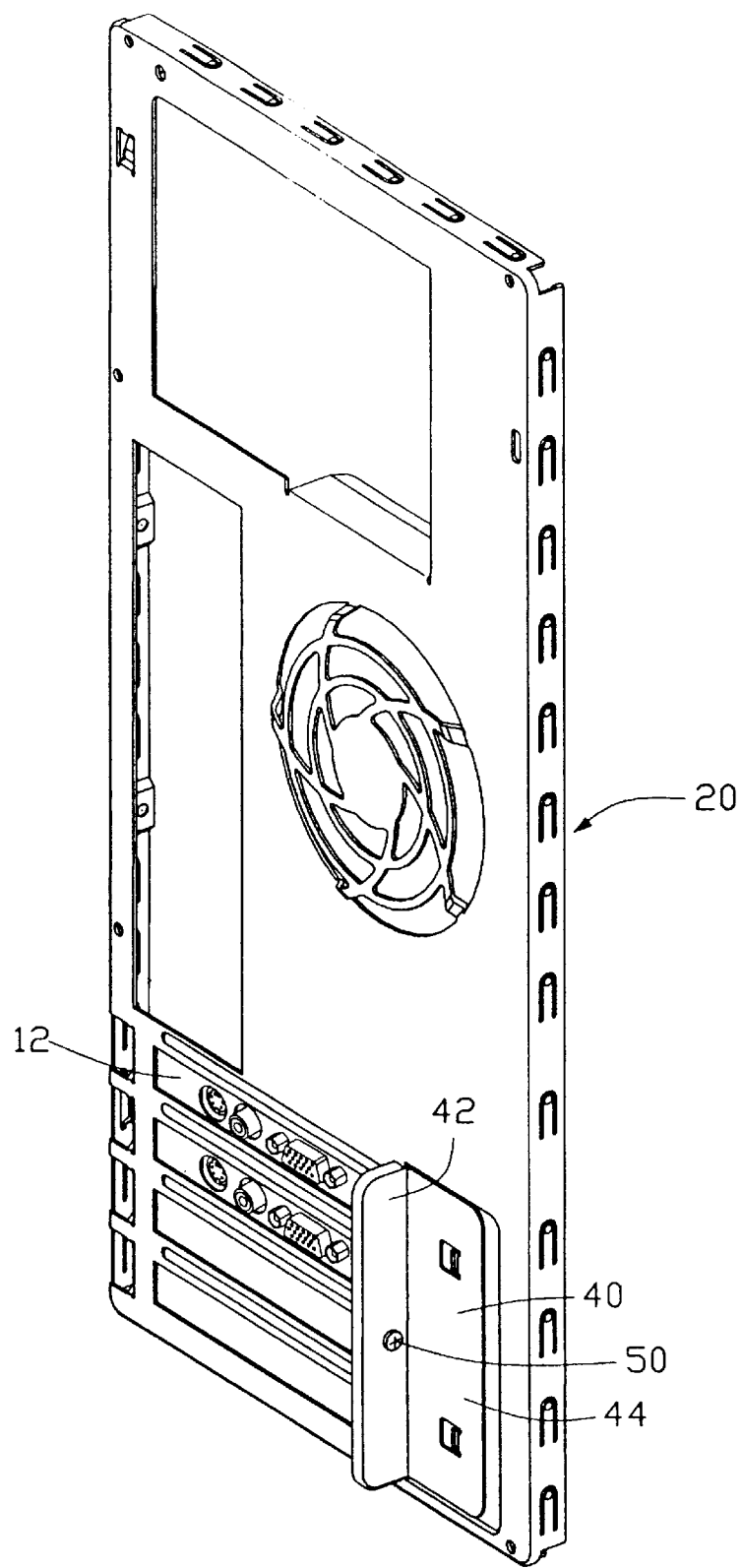
FIG. 4 is a fully-assembled view of FIG. 1, showing the expansion cards fully secured to the rear panel of the card holder.

Referring also to FIGS. 3 and 4, in use, the slot covers 12 of the expansion cards 10 are received into the expansion slots 25 of the rear panel 20. The heads 14 of the expansion cards 10 abut the shield 22 of the rear panel 20, and the protrusions 30 of the rear panel 20 are received in the pits 16 of the corresponding expansion cards 10. The expansion cards 10 are thereby loosely secured to the rear panel 20. The securing portion of the locating plate 40 is then placed onto the indented portion 32 of the rear panel 20, with the hooks 46 of the locating plate 40 passing through the fixing slots 34 of the indented portion 32. The locating plate 40 is pushed toward the shield 22, to cause the hooks 46 to clasp the rear panel 20 at narrowest portions of the fixing slots 34.

The pressing portion 42 of the locating plate 40 abuts the heads 14 of the expansion cards 10. The flange 48 of the locating plate 40 abuts corresponding edges of the shield 22. This provides electromagnetic interference (EMI) shielding for the card holder. The screw 50 is inserted into the through hole 47 of the locating plate 40 to be engaged in the screw hole 28 of the rear panel 20. Thus, the heads 14 of the expansion cards 10 are tightly sandwiched between the pressing portion 42 of the locating plate 40 and the shield 22. The expansion cards 10 are thereby firmly secured to the rear panel 20 by the card holder.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A card holder for securing expansion cards into a computer enclosure, the card holder comprising:

a rear panel of the enclosure, a shield being perpendicularly stamped from the rear panel, a plurality of parallel expansion slots being defined in the rear panel at one side for receiving the expansion cards, a fastening hole being defined in the shield, at least one fixing slot being defined in the rear panel at an opposite side of the shield; and a locating plate comprising a pressing portion and a securing portion, a through hole being defined in the pressing portion corresponding to the fastening hole of the shield, at least one hook being formed on the securing portion and extending through the at least one fixing slot of the rear panel to clasp the rear panel.

2. The card holder as claimed in claim 1, wherein a partition is formed in the rear panel between any two adjacent expansion slots.

3. The card holder as claimed in claim 2, wherein the fastening hole of the shield is defined at one of the partitions.

4. The card holder as claimed in claim 3, wherein a protrusion is formed on the shield at each of the other partitions.

5. The card holder as claimed in claim 1, wherein an indented portion is formed in the rear panel at said opposite side of the shield, and wherein the at least one fixing slot is defined in the indented portion.

6. The card holder as claimed in claim 1, wherein the at least one fixing slot is trapezoidal, and wherein the at least one hook of the locating plate clasps the rear panel at a narrowest portion of the at least one fixing slot.

7. The card holder as claimed in claim 1, wherein a flange extends perpendicularly from free edges of the pressing portion of the locating plate, and wherein the flange abuts corresponding edges of the shield, for electromagnetic interference shielding.

8. The card holder as claimed in claim 1, wherein the at least one hook is L-shaped.

9. The card holder as claimed in claim 1, wherein the fastening hole is a screw hole.

10. A card holder assembly of a computer enclosure, the card holder assembly comprising:

at least one expansion card having a slot cover and a head perpendicular to the slot cover;

a rear panel of the enclosure, a shield being stamped from the rear panel, a fastening hole being defined in the shield, at least one expansion slot being defined in the rear panel at one side of the shield for receiving the slot cover of the at least one expansion card; and a locating plate comprising a pressing portion and a securing portion perpendicular to the pressing portion, the securing portion being attached to the rear panel at an opposite side of the shield, a through hole being defined in the pressing portion corresponding to the fastening hole of the rear panel for insertion of a fastening member thereinto, the pressing portion cooperating with the shield to sandwich the head of the at least one expansion card therebetween, wherein an indented portion is formed in said opposite side of the shield for receiving the securing portion of the locating plate.

11. The card holder assembly as claimed in claim 10, wherein a flange extends perpendicularly from free edges of the pressing portion of the locating plate, and abuts free edges of the shield for electromagnetic interference shielding.

12. The card holder assembly as claimed in claim 10, wherein at least one trapezoidal fixing slot is defined in the indented portion of the rear panel, and at least one L-shaped hook is stamped from the securing portion of the locating plate, for clasping of the locating plate to the rear panel at a narrowest portion of the at least one fixing slot.

13. The card holder assembly as claimed in claim 10, wherein a pit is defined in the head of the at least one expansion card, and wherein at least one protrusion is formed on the shield of the rear panel for engaging in the pit of the at least one expansion card.

14. The card holder assembly as claimed in claim 10, wherein the fastening hole is a screw hole.

15. A card holder assembly of a computer enclosure, the card holder assembly comprising:

at least one expansion card having a slot cover and a head extending from the slot cover;

a rear panel of the enclosure, a shield being perpendicularly stamped from the rear panel, an indented portion being formed in the rear panel, at least one expansion slot being defined in the rear panel at a first side of the shield for receiving the slot cover of the at least one expansion card, wherein the head of the at least one expansion card abuts the shield at a second side thereof opposite to the at least one expansion slot; and a locating plate being secured to the rear panel at said second side of the shield, the locating plate comprising a pressing portion and a securing portion extending from the pressing portion, the securing portion being received in and secured to the indented portion, the pressing portion abutting the head of the at least one expansion card, a fastening member combining the pressing portion, the head of the at least one expansion card and the shield together, the head of the at least one expansion card being thereby firmly sandwiched between the pressing portion and the shield, thus the at least one expansion card being firmly secured to the rear panel.

16. The card holder assembly as claimed in claim 15, wherein the securing portion of the locating plate is clasped to the indented portion with hooks formed on the securing portion.

* * * * *